United States Patent
Singh et al.

(10) Patent No.: US 11,888,507 B2
(45) Date of Patent: Jan. 30, 2024

(54) WIDEBAND RECEIVERS AND METHODS OF OPERATION

(71) Applicant: Adesto Technologies Corporation, Santa Clara, CA (US)

(72) Inventors: Rishi Singh, Cork (IE); Darren Collins, Cork (IE); Cormac O'Sullivan, Cork (IE)

(73) Assignee: Renesas Electronics Corporation

( * ) Notice: Subject to any disclaimer, the term of this patent is extended or adjusted under 35 U.S.C. 154(b) by 243 days.

(21) Appl. No.: 17/408,241

(22) Filed: Aug. 20, 2021

(65) Prior Publication Data

US 2021/0384931 A1    Dec. 9, 2021

Related U.S. Application Data

(63) Continuation of application No. PCT/US2019/059935, filed on Nov. 5, 2019.
(Continued)

(51) Int. Cl.
*G06F 3/033* (2013.01)
*H04B 1/16* (2006.01)
(Continued)

(52) U.S. Cl.
CPC .............. *H04B 1/16* (2013.01); *H03F 1/42* (2013.01); *H03F 3/19* (2013.01); *H03F 3/45475* (2013.01);
(Continued)

(58) Field of Classification Search
CPC ... H04B 1/40; H04B 1/16; H04B 1/38; H04B 1/18; H03F 3/19; H03F 1/42;
(Continued)

(56) References Cited

U.S. PATENT DOCUMENTS

| | | | | |
|---|---|---|---|---|
| 6,029,052 A | * | 2/2000 | Isberg | H03J 5/244 455/190.1 |
| 2008/0057899 A1 | * | 3/2008 | Montemayor | H04B 17/21 455/255 |

(Continued)

*Primary Examiner* — Nhan T Le

(57) ABSTRACT

A receiver can include a first set of one or more amplifier stages configured to amplify input signals in a plurality of communication bands. The receiver can further include a second and third set of one or more amplifier stages. The second set of one or more amplifier stages can be configured to selectively receive the input signals in the plurality of communication bands amplified by the first set of one or more amplifier stages and to amplify one or more input signals in a first one of the plurality of communication bands. Alternatively, the third set of one or more amplifier stages can be configured to selectively receive the input signals in the plurality of communication bands amplified by the first set of one or more amplifier stages and to amplify one or more input signals in a second one of the plurality of communication bands. A first set of one or more mixers can be configured to receive the input signals in the first communication band amplified by the second set of one or more amplifier stages, to receive one or more local oscillator signals for the first communication band, and to generate a baseband signal from a frequency difference of the signal of the first communication band and the one or more local oscillator signals for the first communication band. A second set of one or more mixers can be configured to receive the input signal in the second communication band amplified by the third set of one or more amplifier stages, to receive one or more local oscillator signals for the second communication band, and to generate a baseband signal of the second communication band.

17 Claims, 3 Drawing Sheets

Related U.S. Application Data

(60) Provisional application No. 62/851,489, filed on May 22, 2019.

(51) Int. Cl.

| | | |
|---|---|---|
| H03F 1/42 | (2006.01) | |
| H03F 3/19 | (2006.01) | |
| H03F 3/45 | (2006.01) | |
| H03K 3/011 | (2006.01) | |
| H03K 7/08 | (2006.01) | |
| H03M 1/12 | (2006.01) | |
| H03M 1/66 | (2006.01) | |
| H04B 1/12 | (2006.01) | |
| H04B 1/18 | (2006.01) | |
| H04B 7/0426 | (2017.01) | |
| H03K 5/04 | (2006.01) | |

(52) U.S. Cl.
CPC .............. *H03K 3/011* (2013.01); *H03K 5/04* (2013.01); *H03K 7/08* (2013.01); *H03M 1/128* (2013.01); *H03M 1/1215* (2013.01); *H03M 1/662* (2013.01); *H04B 1/126* (2013.01); *H04B 1/18* (2013.01); *H04B 7/043* (2013.01); H03F 2200/294 (2013.01); H03F 2200/36 (2013.01); H03F 2200/451 (2013.01)

(58) Field of Classification Search
CPC ............. H03F 3/45475; H03F 2200/36; H03F 2200/451; H03F 2200/294; H03K 7/08; H03M 1/1215; H03M 1/128; H03M 1/662

See application file for complete search history.

(56) References Cited

U.S. PATENT DOCUMENTS

| | | | | |
|---|---|---|---|---|
| 2010/0158138 A1* | 6/2010 | Ryu | ................... | H04L 27/3488 375/259 |
| 2016/0218893 A1* | 7/2016 | Waheed | ................ | H04L 25/067 |

* cited by examiner

WIDEBAND RECEIVERS AND METHODS OF OPERATION

CROSS-REFERENCE TO RELATED APPLICATIONS

This is a continuation of PCT Patent Application No. PCT/US2019/059935 filed Nov. 5, 2019, which claims the benefit of U.S. Provisional Patent Application No. 62/851,489 filed May 22, 2019, which are incorporated herein in their entirety.

BACKGROUND OF THE INVENTION

Transmitters and receivers are utilized to send and receive data. In some implementations, the transmitters and receivers are configured for communication over one communication band. In other implementations, the transmitters and receivers can be configured for communication over one or more of a plurality of communication bands. However, when transmitters and receivers are configured for multi-band communications, the transmitters and receivers consume more power as compared to transmitters and receivers configured for single band communication. Furthermore, multi-band communication transmitter and receivers may not be able to achieve one or more desired performance parameters, such as Noise Figure (NF), harmonic rejection, out of band rejection, linearity, input third order intercept point (IIP3) level or the like.

A component manufacturer may fabricate an integrated circuit (IC) including one or more transmitters and or receivers that are configured to communication over one or more of a plurality of communication bands. For example, a component manufacturer may fabricate an IC to include one or more receivers for communication over either the Ka or Ku band. The IC can be configured for use in the Ka or Ku band so that it can be sold to device manufactures that produce different devices for operation in the Ka and Ku band without the need for manufacturing separate ICs.

Although it may be desirable to have receivers that are configured for multi-band communications, conventional multi-band receivers may consume too much power, and or not achieve other desired performance parameters for a given application. Accordingly, there is a continuing need for an improved multi-band receiver.

SUMMARY OF THE INVENTION

The embodiments of the present invention may best be understood by referring to the following description and accompanying drawings that are used to illustrate embodiments of the present technology directed toward wideband receivers and methods of operation. The wideband receivers can include a frontend amplifier stage to receive signals in two or more communication bands. The receivers can also include additional amplifier stages and mixers to process respective communication bands. To receive signal in a given communication band, a corresponding additional amplifier stage and mixer can be coupled between the wideband frontend amplifier and a baseband circuitry. The additional amplifier stages and mixers for the other communication bands can be deactivated. Accordingly, the receiver can provide a wideband amplifier at the frontend, while further amplifying and mixing signals in a given communication band for input to the baseband circuitry.

In one embodiment, a receiver can include one or more wideband amplifier stages, one or more amplifier stages of a first band, one or more amplifier stages of a second band, one or more mixers of the first band, and one or more mixers of the second band. The one or more wideband amplifiers can be configured to amplify input signals in a plurality of communication bands. The one or more amplifier stages of the first band can be configured to amplify one or more input signals in a first one of the plurality of communication bands. The one or more mixers of the first band can be configured to generate one or more baseband signals from a frequency difference between the amplified input signals in the first one of the plurality of communication bands and one or more local oscillator signals for the first communication band. The one or more amplifier stage of the second band can be configured to amplify one or more input signals in a second one of the plurality of communication bands. The one or more mixers of the second band can be configured to generate one or more baseband signals from a frequency difference between the amplified input signals in the second one of the plurality of communication bands and one or more local oscillator signals for the second communication band. A given set of the one or more amplifier stages and the one or more mixers of a given one of the plurality of communication bands can be selectively coupled to the one or more wideband amplifier stages to further amplify the input signals in the given band and generate the one or more baseband signals from the given input signals.

In another embodiment, a method of operation for a wideband receiver can include configuring a plurality of amplifying and down converting channels of a receiver for a respective one of a plurality of communication bands. Upon configuration, input signals in the plurality of communication bands can be amplified together. One or more input signal in the respective one of the plurality of communication bands can be further amplified by a respective amplifying and down converting channel. The amplified one or more input signals in the respective one of the plurality of communication bands can also be down converted to one or more baseband signals in the respective amplifying and down converting channel.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Figure 1:
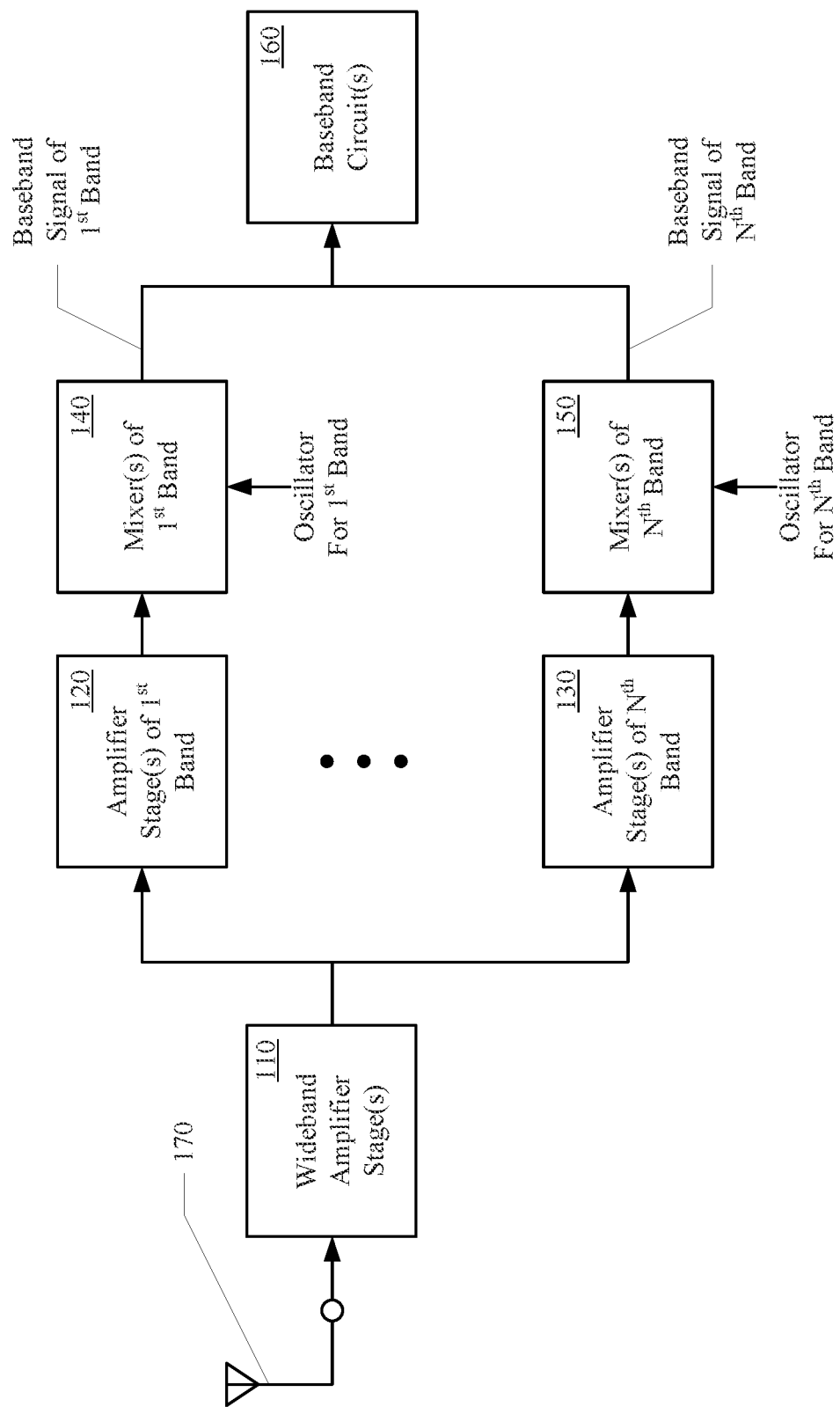
FIG. 1 shows a receiver, in accordance with embodiments of the present invention.

Reference will now be made in detail to the embodiments of the present invention, examples of which are illustrated in the accompanying drawings. While the present invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Some embodiments of the present invention which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present invention, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Referring to FIG. 1, a receiver, in accordance with embodiments of the present invention, is shown. The receiver 100 can include one or more wideband amplifier stages 110, one or more amplifier stages of n respective bands 120, 130, one or more mixers of the n respective bands 140, 150, and one or more baseband circuits 160. The one or more wideband amplifier stages 110 can be coupled to one or more antennas 170. The one or more wideband amplifier stages 110 can include a set of one or more amplifiers configured to amplify input signals in a plurality of communication bands received from the one or more antennas 170. As used herein, the term input signal is broadly used to refer to amplitude modulated, frequency modulated, phase modulated, time division multiplexed, frequency division multiplexed, amplitude division multiplexed, phase division multiplexed, spatial division multiplexed, and the like, and combinations thereof. In one implementation, the receiver for the Ka band can be configured to receive input signals on the downlink in the 10.7-13 Giga Hertz (GHz) frequency spectrum, and the receiver for the Ku band can be configured to receive downlink input signals in the 17.3-22 GHz frequency spectrum in satellite communication systems. However, embodiments of the present invention can be utilized to receive input signals in any plurality of communication bands.

The one or more amplifier stages of a first band 120 can be configured to receive the input signals in the plurality of communication bands amplified by the one or more wideband amplifier stages 110. The one or more amplifier stages of the first band 120 can be configured to further amplify input signals in a first one of the plurality of communication bands. The one or more mixers of the first band 140 can be configured to receive the input signals in the first band amplified by the one or more amplifier stages of the first band 120, receive one or more local oscillator signals for the first communication band, and generate one or more baseband signals from heterodyning the input signals in the first communication band and the local oscillator signals for the first communication band. In one implementation, the one or more mixers of the first band 140 produces the one or more baseband signals from the frequency difference between the input signals in the first communication band and the local oscillator signal for the first communication band.

Similarly the one or more amplifier stages of the $n^{th}$ band 130 can include a set of one or more amplifier stages configured to receive the input signals in the plurality of communication bands amplified by the one or more wideband amplifier stages 110 and further amplify the input signals in the $n^{th}$ one of the plurality of communication bands. The one or more mixers of the $n^{th}$ band 150 can be configured to receive the input signals in the $n^{th}$ band amplified by the one or more amplifier stages of the $n^{th}$ band 130, receive one or more local oscillator signals for the $n^{th}$ communication band, and generate one or more baseband signals from heterodyning the input signals in the $n^{th}$ communication band and the local oscillator signals in the $n^{th}$ communication band. In one implementation the one or more mixers of the $n^{th}$ band 150 produces the one or more baseband signals from the frequency difference between the input signals in the $n^{th}$ communication band and the local oscillator signals in the $n^{th}$ communication band.

In one implementation, the one or more wideband amplifier stages 110 can include one or more Low Noise Amplifiers (LNAs). Similarly, the one or more amplifier stages of the first and second band 120, 130 can include one or more Transconductance Amplifiers (TAs). The combination of the one or more low noise wideband amplifier stages 110 and one or more transconductance amplifier states can be utilized to realize low noise transconductance amplifiers.

A given set of the one or more amplifier stages 120, 130 and a given set of the one or more mixer stages 140, 150 can be selectively coupled between the one or more wideband amplifier stages 110 and the one or more baseband circuits 160. For example, to operate the receiver 100 in the first band, such as the Ka band, the one or more amplifier stages of the first band 120 can be selectively coupled to receive the input signals in the plurality of communication bands amplified by the one or more wideband amplifier stages 110. The one or more amplifier stages of the first band 120 can further amplify the input signals in the first band. The other input signals in the plurality of communication bands are not amplified by the one or more amplifier stages of the first band 120. The one or more mixers of the first band 140 can mix the input signals in the first communication band amplified by the one or more amplifier stages of the first band 120 with one or more local oscillator signals for the first communication band to generate baseband signals. Thereafter, baseband signals from the one or mixers of the first band 140 can be selectively coupled to the baseband circuit 160.

Alternatively, the one or more amplifier stages of the $n^{th}$ band 130, such as the Ku Band, can be selectively coupled to receive the input signals in the plurality of communication bands amplified by the one or more wideband amplifier stages 110. The one or more amplifier stages of the $n^{th}$ band 130 can further amplify the input signals in the first band. The other input signals in the plurality of communication bands are not amplified by the one or more amplifier stages of the $n^{th}$ band 130. The one or more mixers of the $n^{th}$ band 150 can mix the amplified input signals in the $n^{th}$ communication band with one or more local oscillator signals for the $n^{th}$ communication band to generate baseband signals. The baseband signals from the one or mixers of the $n^{th}$ band 150 can be selectively coupled to the baseband circuit 160.

In one implementation, a given set of one or more amplifiers and mixers 120-140 configured for a given communication band can be one time configurable to be selectively coupled between the first set of one or more amplifiers 110 and the one or more baseband circuits 160. In another implementation, a given set of one or more amplifiers and mixers 120-140 configured for a given communication band can be reconfigurable to be selectively coupled between the first set of one or more amplifiers 110 and the one or more baseband circuits 160.

Embodiments of the present technology advantageously utilize a first set of one or more broadband amplifiers to receive one or more input signals in a plurality of communication bands. Furthermore, additional amplification can be performed for a given communication band by a corresponding set of one or more amplifiers configured to amplify the signal in the given communication band, which reduces power consumption by the receiver. Likewise, down conversion of the input signals to baseband signals can be performed by a given set of one or more mixers configured for the given communication band, which further reduces power consumption by the receiver. In addition, the narrowband of the one or more amplifiers and the one or more mixers configured for the given communication band can more easily achieve one or more desired performance parameters, such gain, a desired Noise Figure (NF), harmonic rejection, out of band rejection, linearity, input third order intercept point (IIP3) level or the like, utilizing relatively smaller circuits. Although, the use of amplifiers and mixers configured for a given communication band results in duplications, the narrowband amplifiers and mixers are relatively small. The narrow band amplifiers and mixers can consume a relative smaller area of an Integrated Circuit (IC) than the relatively larger wideband amplifiers and baseband circuits. Therefore, the impact on the area of the IC of the duplicate narrowband amplifier and mixer stages is relatively small. Furthermore, the receiver 100 can be duplicated on an IC for use in beam steering receivers and other similar applications.

Figure 2:
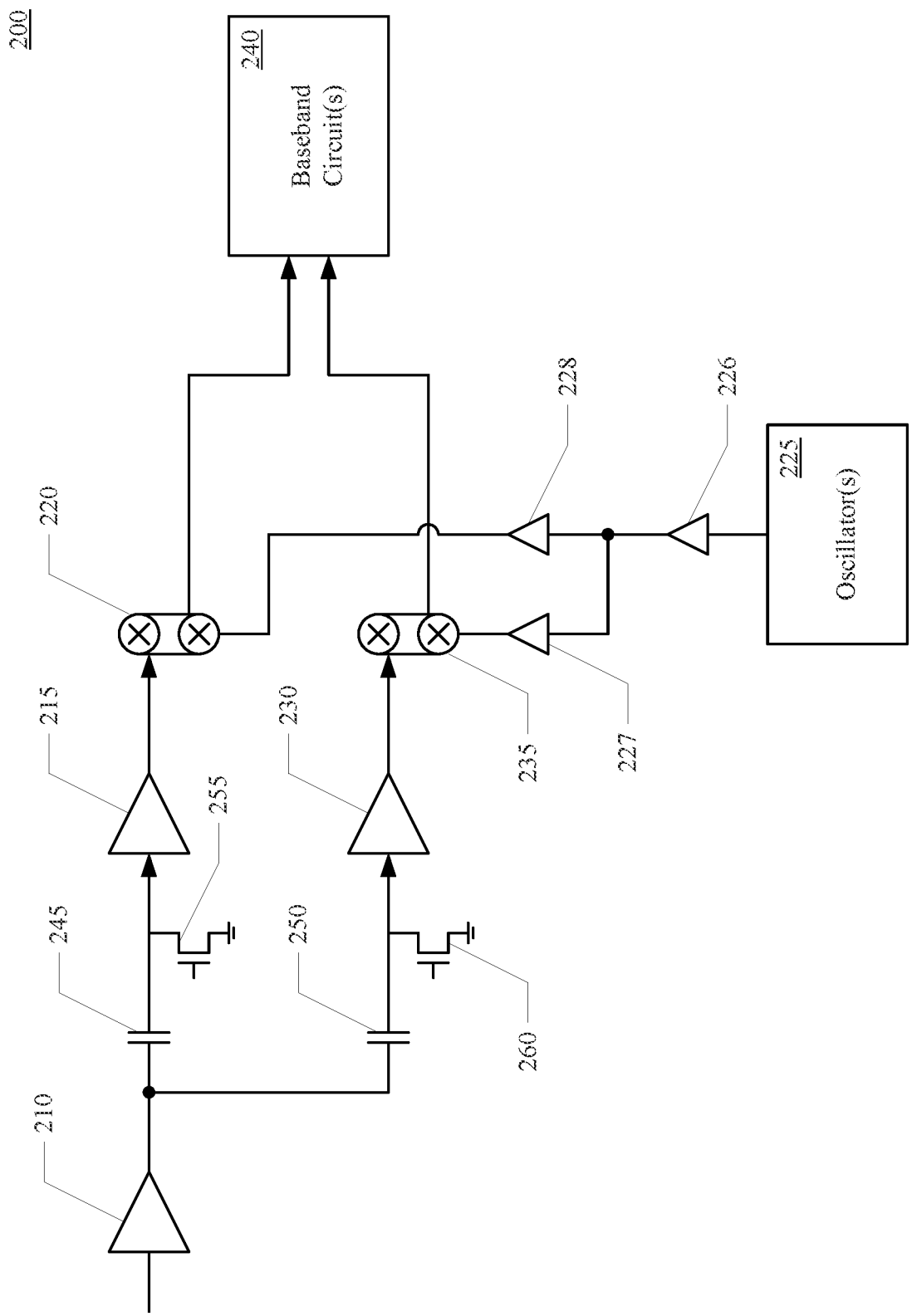
FIG. 2 shows a receiver, in accordance with embodiments of the present invention.

Referring now to FIG. 2, a receiver, in accordance with embodiments of the present invention, is shown. The receiver 200 can include a first set of one or more amplifiers 210 configured to amplify input signals in a plurality of communication bands. In one implementation, the first set of one or more amplifiers 210 can be relatively broadband Low Noise Amplifiers (LNAs) operable to amplify a plurality of communication bands. For example, the first set of one or more amplifiers 210 can be configured to amplify input signals in both the Ka band and the Ku band. The Ka and Ku bands are typically utilized in satellite communication networks.

The receiver 200 can also include a second set of one or more amplifiers 215 selectively couplable to the first set of one or more amplifier stages 210. The second set of one or more amplifiers 215 can be configured to further amplify one or more input signals in a first one of the plurality of communication bands. The second set of one or more amplifiers 215 can have a relatively narrowband that amplifies input signals in the first one of the plurality of communication bands, and not the other input signals. In one implementation, the second set of one or more amplifiers 215 can be relatively narrowband Transconductance Amplifiers (TAs) operable to amplify input signals in the given one of communication bands. A first set of one or more mixers 220 can be coupled to the second set of one or more amplifier stages 215. The first set of one or more mixers 220 can be configured to receive the amplified input signals in the first communication band, and one or more local oscillator signals for the first communication band from one or more local oscillators 225. In one implementation, a first set of one or more oscillators can be configured to generate one or more local oscillator signals for the first communication band, and a second set of one or more oscillators can be configured to generate one or more oscillator signals for the second communication band. In another implementation, a wideband oscillator can be configured to generate one or more local oscillator signals for the first communication band and one or more local oscillator signals for the second communication band. In one implementation, the one or more local oscillator signals generated by the one or more local oscillators 225 can be buffered by one or more buffers 226, 227, 228. The one or more buffers 226, 227, 228 are not necessary for an understanding of aspects of the present technology, and therefore are not described further herein.

The first set of one or more mixers 220 can be configured to generate one or more baseband signals. In one implementation, the baseband signals can be produced by the first set of one or more mixers 220 based on a frequency difference of the amplified input signals in the first communication band and the local oscillator signals for the first communication band. Optionally, one or more filters (not shown) can be coupled along the transmission path of the second set of one or more amplifiers 215 and the first set of one or more mixers 220 to attenuate the other input signals in the plurality of communication bands. The one or more filters are not necessary for an understanding of aspects of the present technology, and therefore are not described further herein.

The receiver 200 can also include a third set of one or more amplifiers 230 selectively couplable to the first set of one or more amplifier stages 210. The third set of one or more amplifiers can be configured to amplify one or more input signals in a second one of the plurality of communication bands. The third set of one or more amplifiers 230 can have a relatively narrow band that amplifies input signals in the second one of the plurality of communication bands, and not the other input signals. In one implementation, the third set of one or more amplifiers 230 can also be relatively narrowband Transconductance Amplifiers (TAs) operable to amplify signals in the given one of communication bands. A second set of one or more mixers 235 can be coupled to the third set of one or more amplifiers 230. The second set of one or more mixers can be configured to receive the amplified input signals, and one or more local oscillator signal for the second communication band from the one or more local oscillators 225. The second set of one or more mixers 235 can be configured to generate one or more baseband signals. In one implementation, the baseband signals can be produced by the second set of one or more mixers 235 based on a frequency difference of the amplified input signals in the second communication band and the local oscillator signals for the second communication band. Optionally, one or more filters (not shown) can be coupled along the transmission path of the second set of one or more amplifiers 230 and the first set of one or more mixers 235 to attenuate the other input signals in the plurality of communication bands. The one or more filters are not necessary for an understanding of aspects of the present technology, and therefore are not described further herein.

The receiver 200 can also include one or more baseband circuits 240 coupled to the first and second sets of one or more mixers 220, 235. The one or more baseband circuits 240 can be configured to selectively receive the one or more baseband signals from the first set of one or more mixers 220 or the one or more baseband signals from the second set of mixers 235. The one or more baseband circuits 240 can include filters, amplifiers, Analog-to-Digital Decoders (ADEC), and or the like. The one or more baseband circuits 240 are not necessary for an understanding of aspects of the present technology, and therefore are not described further herein.

In one implementation, the second set of one or more amplifiers 215 and third set of one or more amplifiers 230 can be capacitively coupled 245, 250 to the first set of one or more amplifiers 210. In another implementation, the receiver 200 can further include one or more splitters, diplexers, or the like (not shown) to couple the amplified input signals in the plurality of communication bands from the first set of one or more amplifiers 210 to the second set of one or more amplifiers 215 and the third set of one or more amplifiers 230.

In one implementation, the receiver 200 can also include one or more sets of selection elements 255, 260 for coupling respective ones of the second and third sets of one or more amplifiers 215, 230 to the first set of one or more amplifiers 210, and respective ones of the first and second sets of mixers 220, 235 to the one or more baseband circuits 240. For example, a first switch 255, such as a transistor, can selectively allow input signals from the first set of one or more amplifiers 210 to be coupled to an input of the second set of one or more amplifiers 215, and a second switch 260 can selectively pull the input to the third set of one or more amplifiers 230 to a given state e.g., a ground potential), or vice versa. The switches 255, 260, can be configured during product manufacturing, or upon setup or initialization of the receiver 200. The switches 255, 260 can optionally also be reconfigurable during an operating mode of the receiver 200. In another example, a first fuse (not shown) can be one time configurable (e.g., blown) to allow input signals from the first set of one or more amplifiers 210 to be coupled to input of the second set of one or more amplifiers 215, and a second fuse can be one time configurable (e.g., not blown) to pull the input to the third set of one or more amplifiers 230 to ground, or vice versa.

Although the receiver 200 as illustrated is configured for use with input signals in two communication bands, the receiver 200 can readily be extended for use with input signals in three or more communication bands. Additional sets of one or more relatively narrowband amplifiers and one or more narrowband mixers configured for a respective communication band can be similarly selectively couplable between the first set of one or more relatively wide band amplifiers 210 and the one or more baseband circuits 240.

Embodiments of the present technology advantageously utilize a first set of one or more broadband amplifiers to receive one or more input signals in a plurality of communication bands. Furthermore, additional amplification can be performed for a given communication band by a corresponding set of one or more amplifiers configured to amplify the signal in the given communication band, which reduces power consumption by the receiver. Likewise, down conversion of the input signals to baseband signals can be performed by a given set of one or more mixers configured for the given communication band, which further reduces power consumption by the receiver.

In addition, the narrowband of the one or more amplifiers and the one or more mixers configured for the given communication band can more easily achieve one or more desired performance parameters, such as gain, a desired Noise Figure (NF), harmonic rejection, out of band rejection, linearity, Input Third Order Intercept Point (IIP3) level or the like, utilizing relatively smaller circuits. Although, the use of amplifiers and mixers configured for a given communication band results in duplications, the narrowband amplifiers and mixers are relatively small. The narrow band amplifiers and mixers can consume a relative smaller area of an Integrated Circuit (IC) than the relatively larger wideband amplifiers and baseband circuits. Therefore, the impact on the area of the IC of the duplicate narrowband amplifier and mixer stages is relatively small. Furthermore, the receiver 200 can be duplicated on an IC for use in beam steering receivers and other similar applications.

Figure 3:
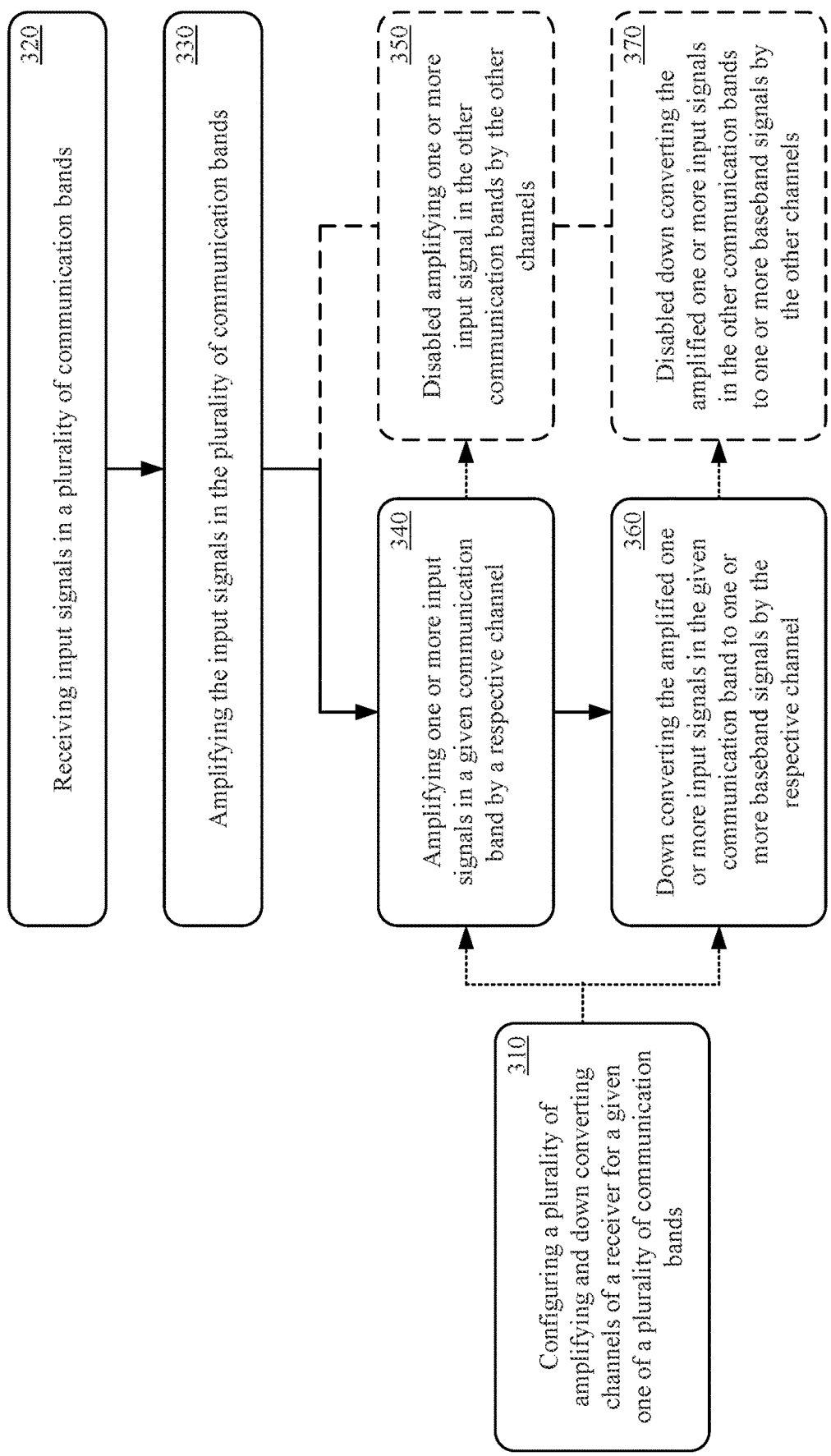
FIG. 3 shows a method of receiving one or more signals, in accordance with embodiments of the present invention.

Referring now to FIG. 3, a method of receiving one or more signals, in accordance with embodiments of the present invention, is shown. The method can include configuring a plurality of amplification and down converting channels of a receiver for a given one of a plurality of communication bands, at 310. For example, a given channel configured to amplify and down convert input signals for a given one of a plurality of communication bands can be enabled. The other channels configured to amplify and down convert input signals in the other respective ones of the plurality of communication bands can be disabled. In one implementation, the channels for amplifying and down converting input signals for respective ones of the plurality of communication bands can be one time configurable as part of the manufacturing process, during install or deployment of the device, or upon startup of the device. Alternatively or in addition, the channels for amplifying and down converting input signals for respective ones of the plurality of communication bands can be reconfigurable at startup and or during operation of the device.

At 320, input signals in a plurality of communication bands can be received. In an exemplary implementation, the plurality of communication bands can include the Ka and Ku communication bands. At 330, the input signals in the plurality of communication bands can be amplified. For example, input signal in both the Ka and Ku bands can be amplified.

At 340, one or more input signals in a given communication band can be amplified by a respective communication channel enabled during configuration of the plurality of amplification and down converting channels. At 350, the input signals in the other communication bands are not amplified as a result of the respective other amplifying and down converting channels being disabled during configuration of the plurality of amplification and down converting channels. For example, signals in the Ka band can be further amplified, while the signals in the Ku band are not, or vice versa.

At 360, the one or more input signal in the given communication band can be down converted to one or more baseband signals by the respective communication channel enabled during configuration of the plurality of amplification and down converting channels. At 370, the input signal in the other communication bands are not down converted as a result of the respective other amplifying and down converting channels being disabled during configuration of the plurality of amplification and down converting channels. For example, the amplified input signals in the Ka band can be down converted when the respective down converting channel for the Ka band is enabled. At the same time, the input signal in the Ku band are not amplified and down converted because the respective amplification and down converting channel for the Ku band is disabled.

Embodiments of the present technology can advantageously reduce power consumption and or achieve one or more performance parameters by performing a first portion of amplification on input signals in a plurality of communication bands, and subsequently providing further amplification for a given one of the plurality of communication bands. The power consumption can be further reduced and or the one or more performance parameters can be further achieved, by generating baseband signals from the further amplified input signals in the given one of the plurality of communication bands.

The following examples pertain to specific technology embodiments and point out specific features, elements, or steps that may be used or otherwise combined in achieving such embodiments.

Example 1 includes a receiver comprising: one or more wideband amplifier stages 110 configured to amplify input signals in a plurality of communication bands; one or more amplifier stages of a first band 120 configured to amplify one or more input signals in a first one of the plurality of communication bands; one or more mixers of the first band 140 configured to generate one or more baseband signals from a frequency difference between the amplified input signals in the first one of the plurality of communication bands and one or more local oscillator signals for the first communication band; one or more amplifier stages of a second band 130 configured to amplify one or more input signals in a second one of the plurality of communication bands; one or more mixers of the second band 150 configured to generate one or more baseband signals from a frequency difference between the amplified input signals in the second one of the plurality of communication bands and one or more local oscillator signals for the second communication band; and one or more baseband circuits 160 configured to receive the one or more baseband signals; wherein one or more amplifier stages of a given one of the plurality of communication bands and one or more of the mixers of the given one of the plurality of communication bands is selectively coupled between the one or more wideband amplifier stages 110 and the one or more baseband circuits 160.

Example 2 includes the receiver according to Example 1, wherein: the one or more amplifier stages of the first band 120 is capacitively coupled to the one or more wideband amplifier stages; and the one or more amplifier stages of the second band 130 is capacitively coupled to the one or more wideband amplifier stages.

Example 3 includes the receiver according to Example 1, further comprising: one or more amplifier stages of an Nth band configured to amplify one or more input signals in an Nth one of the plurality of communication bands; and one or more mixers of the Nth band configured to generate one or more baseband signals from a frequency difference between the amplified input signals in the Nth one of the plurality of communication bands and one or more local oscillator signals for the Nth communication band.

Example 4 includes a receiver comprising: a first set of one or more amplifier stages 210 configured to amplify input signals in a plurality of communication bands; a second set of one or more amplifier stages 215 selectively couplable 255 to the first set of one or more amplifier stages 210, wherein the second set of one or more amplifier stages 215 are configured to selectively receive the input signals in the plurality of communication bands amplified by the first set of one or more amplifier stages 210 and to amplify one or more input signals in a first one of the plurality of communication bands; a first set of one or more mixers 220 coupled to the second set of one or more amplifier stages 215, wherein the first set of one or more mixers 220 are configured to receive the one or more input signals in the first communication band amplified by the second set of one or more amplifier stages 215, to receive one or more local oscillator signals for the first communication band, and to generate a baseband signal of the first communication band; a third set of one or more amplifier stages 230 selectively couplable to the first set of one or more amplifier stages 210, wherein the third set of one or more amplifier stages 230 are configured to selective receive the input signals in the plurality of communication bands amplified by the first set of one or more amplifier stages 210 and to amplify one or more input signals in a second one of the plurality of communication bands; and a second set of one or more mixers 235 coupled to the third set of one or more amplifier stages 230, wherein the second set of one or more mixers 235 are configured to receive the one or more signals in the second communication band amplified by the third set of one or more amplifier stages 230, to receive one or more local oscillator signals for the second communication band, and to generate a baseband signal of the second communication band.

Example 5 includes the receiver according to Example 4, wherein the plurality of communication bands include a plurality of satellite communication bands.

Example 6 includes the receiver according to Example 5, wherein the plurality of satellite communication bands include a Ka band and a Ku band.

Example 7 includes the receiver according to Example 4, wherein the first set of one or more amplifier stages 210 includes a low noise amplifier.

Example 8 includes the receiver according to Example 7, wherein: the second set of one or more amplifier stages 215 includes a first transconductance amplifier selectively coupled to the low noise amplifier; and the third set of one or more amplifier stages 230 includes a second transconductance amplifier selectively coupled to the low noise amplifier.

Example 9 includes the receiver according to Example 4, further comprising: a first capacitor 245 coupled between the first set of one or more amplifier stages 210 and the second set of one or more amplifier stages 215; and a second capacitor 250 coupled between the first set of one or more amplifier stages 210 and the third set of one or more amplifier stages 230.

Example 10 includes the receiver according to Example 4, further comprising: a first selection element 255 configured to selectively couple the second set of one or more amplifier stages 215 to the first set of one or more amplifier stages 210; and a second selection element 260 configured to selectively couple the third set of one or more amplifier stages 230 to the first set of one or more amplifier stages 210.

Example 11 includes the receiver according to Example 10, wherein: the first selection element 255 includes a first switch selectively configurable to pull an input of the second set of one or more amplifier stages 215 to a given state; and the second selection element 260 includes a second switch selective configurable to pull an input of the third set of one or more amplifier stages 230 to the given state.

Example 12 includes the receiver according to Example 11, wherein: the first switch comprises a first transistor configurable to pull the input of the second set of one or more amplifier stages to a ground potential; and the second switch comprises a second transistor configurable to pull the input of the third set of one or more amplifier stages to the ground potential.

Example 13 includes the receiver according to Example 4, further comprising: one or more baseband circuits 240 coupled to the first and second sets of one or more mixers 220, 235.

Example 14 includes the receiver according to Example 3, further comprising: one or more local oscillators 225 configured to generate the one or more local oscillator signals for the first and second communication bands.

Example 15 includes a method of receiving one or more input signals comprising: configuring a plurality of amplifying and down converting channels of a receiver for a respective given one of a plurality of communication bands 310: amplifying input signals in the plurality of communication bands together 330; amplifying one or more input signals in the given one of the plurality of communication bands by a respective amplifying and down converting channel 340; and down converting the amplified one or more input signals in the given one of the plurality of communication bands to one or more baseband signals by the respective amplifying and down converting channel 360.

Example 16 includes the method of Example 15, wherein configuring the plurality of amplifying and down converting channels comprises: enabling amplifying one or more input signals in the given one of the plurality of communication bands by the respective amplifying and down converting channel 340; disabling amplifying one or more input signals in other ones of the plurality of communication bands by respective other amplifying and down converting channels 350; enabling down converting the amplified one or more input signals in the given one of the plurality of communication bands to one or more baseband signals by the respective amplifying and down converting channel 360; and disabling down converting one or more input signals in the other ones of the plurality of communication bands to one or more baseband signals by the respective other amplifying and down converting channels 370.

Example 17 includes the method of Example 15, wherein configuring the plurality of amplifying and down converting channels is performed during one or more of manufacturing, installation, deployment, startup and operation.

Example 18 includes the method of Example 17, wherein the plurality of amplifying and down converting channels is one time configurable.

Example 19 includes the method of Example 17, wherein the plurality of amplifying and down converting channels is reconfigurable.

Example 20 includes the method of Example 15, wherein the plurality of communication bands include a Ka communication band and a Ku communication band.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present invention and its practical application, to thereby enable others skilled in the art to best utilize the present invention and various embodiments with various modifications as are suited to the particular use contemplated. It is intended that the scope of the invention be defined by the claims appended hereto and their equivalents.

What is claimed is:

1. A receiver comprising:
one or more wideband amplifier stages configured to amplify input signals in a plurality of communication bands;
one or more amplifier stages of a first band capacitively coupled to the one or more wideband amplifier stages, wherein the one or more amplifier stages of the first band are configured to amplify one or more input signals in a first one of the plurality of communication bands;
one or more mixers of the first band configured to generate one or more baseband signals from a frequency difference between the amplified input signals in the first one of the plurality of communication bands and one or more local oscillator signals for the first communication band;
one or more amplifier stages of a second band capacitively coupled to the one or more wideband amplifier stages, wherein the one or more amplifier stages of the second band are configured to amplify one or more input signals in a second one of the plurality of communication bands;
one or more mixers of the second band configured to generate one or more baseband signals from a frequency difference between the amplified input signals in the second one of the plurality of communication bands and one or more local oscillator signals for the second communication band; and
one or more baseband circuits configured to receive the one or more baseband signals;
wherein one or more amplifier stages of a given one of the plurality of communication bands and one or more of the mixers of the given one of the plurality of communication bands is selectively coupled between the one or more wideband amplifier stages and the one or more baseband circuits.

2. The receiver according to claim 1, further comprising:
one or more amplifier stages of an Nth band configured to amplify one or more input signals in an Nth one of the plurality of communication bands; and
one or more mixers of the Nth band configured to generate one or more baseband signals from a frequency difference between the amplified input signals in the Nth one of the plurality of communication bands and one or more local oscillator signals for the Nth communication band.

3. The receiver according to claim 2, further comprising:
one or more local oscillators configured to generate the one or more local oscillator signals for the first and second communication bands.

4. A receiver comprising:
a first set of one or more amplifier stages configured to amplify input signals in a plurality of communication bands;
a second set of one or more amplifier stages selectively couplable to the first set of one or more amplifier stages, wherein the second set of one or more amplifier stages are configured to selectively receive the input signals in the plurality of communication bands amplified by the first set of one or more amplifier stages and to amplify one or more input signals in a first one of the plurality of communication bands;
a first capacitor coupled between the first set of one or more amplifier stages and the second set of one or more amplifier stages;
a first set of one or more mixers coupled to the second set of one or more amplifier stages, wherein the first set of one or more mixers are configured to receive the one or more input signals in the first communication band amplified by the second set of one or more amplifier stages, to receive one or more local oscillator signals for the first communication band, and to generate a baseband signal of the first communication band;
a third set of one or more amplifier stages selectively couplable to the first set of one or more amplifier stages, wherein the third set of one or more amplifier stages are configured to selective receive the input signals in the plurality of communication bands amplified by the first set of one or more amplifier stages and to amplify one or more input signals in a second one of the plurality of communication bands;
a second capacitor coupled between the first set of one or more amplifier stages and the third set of one or more amplifier stages; and
a second set of one or more mixers coupled to the third set of one or more amplifier stages, wherein the second set of one or more mixers are configured to receive the one or more signals in the second communication band amplified by the third set of one or more amplifier stages, to receive one or more local oscillator signals for the second communication band, and to generate a baseband signal of the second communication band.

5. The receiver according to claim 4, wherein the plurality of communication bands include a plurality of satellite communication bands.

6. The receiver according to claim 5, wherein the plurality of satellite communication bands include a Ka band and a Ku band.

7. The receiver according to claim 4, wherein the first set of one or more amplifier stages includes a low noise amplifier.

8. The receiver according to claim 7, wherein:
the second set of one or more amplifier stages includes a first transconductance amplifier selectively coupled to the low noise amplifier; and
the third set of one or more amplifier stages includes a second transconductance amplifier selectively coupled to the low noise amplifier.

9. The receiver according to claim 4, further comprising:
a first selection element configured to selectively couple the second set of one or more amplifier stages to the first set of one or more amplifier stages; and
a second selection element configured to selectively couple the third set of one or more amplifier stages to the first set of one or more amplifier stages.

10. The receiver according to claim 9, wherein:
the first selection element includes a first switch selectively configurable to pull an input of the second set of one or more amplifier stages to a given state; and
the second selection element includes a second switch selective configurable to pull an input of the third set of one or more amplifier stages to the given state.

11. The receiver according to claim 10, wherein:
the first switch comprises a first transistor configurable to pull the input of the second set of one or more amplifier stages to a ground potential; and
the second switch comprises a second transistor configurable to pull the input of the third set of one or more amplifier stages to the ground potential.

12. The receiver according to claim 4, further comprising:
one or more baseband circuits coupled to the first and second sets of one or more mixers.

13. A method of receiving one or more input signals comprising:
configuring a plurality of amplifying and down converting channels of a receiver for a respective given one of a plurality of communication bands, wherein configuring the plurality of amplifying and down converting channels includes;
enabling amplifying one or more input signals in the given one of the plurality of communication bands by the respective amplifying and down converting channel;
disabling amplifying one or more input signals in other ones of the plurality of communication bands by respective other amplifying and down converting channels;
enabling down converting the amplified one or more input signals in the given one of the plurality of communication bands to one or more baseband signals by the respective amplifying and down converting channel; and
disabling down converting one or more input signals in the other ones of the plurality of communication bands to one or more baseband signals by the respective other amplifying and down converting channels;
amplifying input signals in the plurality of communication bands together;
amplifying one or more input signals in the given one of the plurality of communication bands by a respective amplifying and down converting channel; and
down converting the amplified one or more input signals in the given one of the plurality of communication bands to one or more baseband signals by the respective amplifying and down converting channel.

14. The method of claim 13, wherein configuring the plurality of amplifying and down converting channels is performed during one or more of manufacturing, installation, deployment, startup and operation.

15. The method of claim 14, wherein the plurality of amplifying and down converting channels is one time configurable.

16. The method of claim 14, wherein the plurality of amplifying and down converting channels is reconfigurable.

17. The method of claim 13, wherein the plurality of communication bands include a Ka communication band and a Ku communication band.

* * * * *